United States Patent
Yan et al.

(10) Patent No.: US 11,257,425 B2
(45) Date of Patent: Feb. 22, 2022

(54) DISPLAY PANEL AND METHOD FOR MANUFACTURING THE SAME, PIXEL LIGHT EMITTING COMPENSATION METHOD AND DISPLAY APPARATUS

(71) Applicant: BOE TECHNOLOGY GROUP CO., LTD., Beijing (CN)

(72) Inventors: Huajie Yan, Beijing (CN); Qingyu Huang, Beijing (CN); Xiaohu Li, Beijing (CN); Tun Liu, Beijing (CN); Liangliang Kang, Beijing (CN); Juan Zhang, Beijing (CN); Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/641,072

(22) PCT Filed: Aug. 30, 2019

(86) PCT No.: PCT/CN2019/103714
§ 371 (c)(1),
(2) Date: Feb. 21, 2020

(87) PCT Pub. No.: WO2020/107980
PCT Pub. Date: Jun. 4, 2020

(65) Prior Publication Data
US 2021/0142722 A1 May 13, 2021

(30) Foreign Application Priority Data
Nov. 30, 2018 (CN) .......................... 201811453407.4

(51) Int. Cl.
*G09G 3/3225* (2016.01)
*G09G 3/3291* (2016.01)
(Continued)

(52) U.S. Cl.
CPC ......... *G09G 3/3225* (2013.01); *G09G 3/3291* (2013.01); *H01L 21/76804* (2013.01);
(Continued)

(58) Field of Classification Search
CPC ..................... G09G 3/3225; G09G 2300/0439
See application file for complete search history.

(56) References Cited

U.S. PATENT DOCUMENTS

| | | | |
|---|---|---|---|
| 6,747,638 B2 | 6/2004 | Yamazaki et al. | |
| 7,525,523 B2 | 4/2009 | Yamazaki et al. | |

(Continued)

FOREIGN PATENT DOCUMENTS

| | | |
|---|---|---|
| CN | 1319831 A | 10/2001 |
| CN | 1934605 A | 3/2007 |

(Continued)

OTHER PUBLICATIONS

First Chinese Office Action dated Nov. 13, 2020, received for corresponding Chinese Application No. 201811453407.4, 30 pages.
(Continued)

*Primary Examiner* — Kevin M Nguyen
(74) *Attorney, Agent, or Firm* — Kinney & Lange, P.A.

(57) ABSTRACT

The present disclosure provides a display panel and a method for manufacturing the same, a pixel light emitting compensation method, and a display apparatus. The display panel comprises a plurality of pixel units arranged in an array, wherein each of the pixel units comprises: an array substrate comprising a pixel driving circuit; a pixel defining layer disposed on a first surface of the array substrate and having a via hole wherein the first surface is far away from a substrate of the array substrate; a light emitting unit disposed in the via hole, wherein the light emitting unit is electrically connected to an output terminal of the pixel driving circuit, so that driving current output by the pixel
(Continued)

driving circuit drives the light emitting unit to emit light; and a photoelectric converter configured to receive the light emitted by the light emitting unit.

9 Claims, 8 Drawing Sheets

(51) Int. Cl.
*H01L 21/768* (2006.01)
*H01L 27/146* (2006.01)
*H01L 27/32* (2006.01)
*H01L 51/52* (2006.01)
*H01L 51/56* (2006.01)
*G09G 3/3266* (2016.01)

(52) U.S. Cl.
CPC ...... *H01L 27/1461* (2013.01); *H01L 27/3246* (2013.01); *H01L 27/3269* (2013.01); *H01L 51/524* (2013.01); *H01L 51/56* (2013.01); *G09G 3/3266* (2013.01); *G09G 2300/0439* (2013.01); *G09G 2320/0626* (2013.01); *H01L 2227/323* (2013.01)

(56) References Cited

U.S. PATENT DOCUMENTS

| | | | |
|---|---|---|---|
| 8,310,413 | B2 | 11/2012 | Fish et al. |
| 8,456,459 | B2 | 6/2013 | Yamazaki et al. |
| 8,830,217 | B2 | 9/2014 | Yamazaki et al. |
| 10,811,481 | B2 | 10/2020 | Hu et al. |
| 2002/0044208 | A1* | 4/2002 | Yamazaki ............ H01L 27/3269 348/272 |
| 2002/0079512 | A1 | 6/2002 | Yamazaki et al. |
| 2014/0240370 | A1 | 8/2014 | Sakairi et al. |
| 2018/0060641 | A1* | 3/2018 | Kim ..................... G06K 9/0004 |
| 2018/0173349 | A1* | 6/2018 | Cho ..................... H01L 51/0097 |
| 2018/0293958 | A1 | 10/2018 | Cote et al. |
| 2019/0287453 | A1* | 9/2019 | Weng ................... G09G 3/3208 |

FOREIGN PATENT DOCUMENTS

| | | | |
|---|---|---|---|
| CN | 104009060 | A | 8/2014 |
| CN | 105070734 | A | 11/2015 |
| CN | 107464529 | A | 12/2017 |
| CN | 108230997 | A | 6/2018 |
| CN | 108258024 | A | 7/2018 |
| CN | 108538255 | A | 9/2018 |
| CN | 108831912 | A | 11/2018 |
| CN | 108878503 | A | 11/2018 |

OTHER PUBLICATIONS

International Search Report and Written Opinion dated Nov. 19, 2019, for corresponding PCT Application No. PCT/CN2019/103714.

* cited by examiner

DISPLAY PANEL AND METHOD FOR MANUFACTURING THE SAME, PIXEL LIGHT EMITTING COMPENSATION METHOD AND DISPLAY APPARATUS

CROSS-REFERENCE TO RELATED APPLICATION(S)

This application is the U.S. National Phase of PCT Application No. PCT/CN2019/103714 filed Aug. 30, 2019, which in turn claims priority to the Chinese Patent Application No. CN201811453407.4, filed on Nov. 30, 2018, which is incorporated herein by reference in its entirety.

TECHNICAL FIELD

The present disclosure relates to the field of display, and particularly to a display panel and a method for manufacturing the same, a pixel light emitting compensation method, and a display apparatus.

BACKGROUND

Due to factors such as IR-Drop, a shift of a threshold voltage, and degradation of an Organic Light Emitting Display (OLED) material itself, brightness and a color of display of an Active Matrix Organic Light Emitting Display (AMOLED) may deviate as usage time becomes longer, and therefore the brightness and the color of the AMOLED need to be compensated.

SUMMARY

According to an aspect of the present disclosure, there is proposed a display panel. The display panel comprises a plurality of pixel units arranged in an array. Each of the pixel units comprises: an array substrate comprising a pixel driving circuit; a pixel defining layer disposed on a first surface of the array substrate and having a via hole, wherein the first surface is far away from a substrate of the array substrate; a light emitting unit disposed in the via hole, wherein the light emitting unit is electrically connected to an output terminal of the pixel driving circuit, so that driving current output by the pixel driving circuit drives the light emitting unit to emit light; and a photoelectric converter configured to receive the light emitted by the light emitting unit.

In some embodiments, the pixel defining layer comprises a light transmitting portion which forms a light transmitting region on sidewalls of the via hole, and the photoelectric converter is configured to receive the light emitted by the light emitting unit through at least the light transmitting portion.

In some embodiments, orthographic projection of the photoelectric converter on the array substrate at least partially overlaps with orthographic projection of the light transmitting portion on the array substrate.

In some embodiments, orthographic projection of the photoelectric converter on the array substrate does not overlap with orthographic projection of the light emitting unit on the array substrate.

In some embodiments, the display panel further comprises: a photoelectric reading circuit electrically connected to the photoelectric converter to read a photoelectric signal generated by the photoelectric converter.

In some embodiments, the photoelectric converter and the photoelectric reading circuit are disposed in the array substrate.

In some embodiments, the pixel driving circuit comprises a driving transistor having one of a source or a drain electrically connected to the output terminal of the pixel driving circuit to generate driving current and provide the driving current to the output terminal of the pixel driving circuit. The photoelectric reading circuit comprises a reading control transistor having one of a source or a drain electrically connected to the photoelectric converter, and the other of the source or the drain electrically connected to a signal reading line to control the reading of the photoelectric signal generated by the photoelectric converter through the signal reading line. The driving transistor and the reading control transistor are formed by the same process.

In some embodiments, the photoelectric converter is located between the pixel defining layer and the photoelectric reading circuit in a direction perpendicular to the array substrate.

In some embodiments, the display panel further comprises an upper cover which covers the pixel defining layer. The photoelectric converter and the photoelectric reading circuit are disposed in the upper cover.

In some embodiments, the light emitting unit is an organic light emitting diode which comprises an anode layer, an organic layer, and a cathode layer which are sequentially stacked on the first surface, wherein the anode layer is electrically connected to the output terminal of the pixel driving circuit.

In some embodiments, the display panel further comprises a compensation processor electrically connected to the photoelectric reading circuit through a signal reading line, and configured to: receive the photoelectric signal from the photoelectric reading circuit; and calculate a brightness compensation value based on the photoelectric signal.

According to another aspect of the present disclosure, there is proposed a method of manufacturing a display panel comprising a plurality of pixel units arranged in an array. The method comprises the following steps for each of the pixel units: forming an array substrate comprising a pixel driving circuit, a photoelectric reading circuit, and a photoelectric converter, wherein the photoelectric reading circuit is electrically connected to the photoelectric converter; forming a pixel defining layer on a first surface of the array substrate wherein the first surface is far away from a substrate of the array substrate; forming a via hole in the pixel defining layer; and forming a light emitting unit in the via hole, so that the light emitting unit is electrically connected to an output terminal of the pixel driving circuit, wherein the photoelectric converter and the light emitting unit are formed so that light emitted by the light emitting unit is received by the photoelectric converter.

In some embodiments, the step of forming the pixel defining layer further comprises: forming a light transmitting portion in the pixel defining layer, wherein the light transmitting portion forms a light transmitting region on sidewalls of the via hole.

In some embodiments, the photoelectric converter is formed to receive the light emitted by the light emitting unit through at least the light transmitting portion.

In some embodiments, the photoelectric converter and the light transmitting portion are formed so that orthographic projection of the photoelectric converter on the array substrate at least partially overlaps with orthographic projection of the light transmitting portion on the array substrate.

In some embodiments, the photoelectric converter and the light emitting unit are formed so that orthographic projection of the photoelectric converter on the array substrate does not overlap with orthographic projection of the light emitting unit on the array substrate.

In some embodiments, the pixel driving circuit comprises a driving transistor having one of a source or a drain electrically connected to the output terminal of the pixel driving circuit to generate driving current and provide the driving current to the output terminal of the pixel driving circuit. The photoelectric reading circuit comprises a reading control transistor having one of a source or a drain electrically connected to the photoelectric converter, and the other of the source or the drain electrically connected to a signal reading line to control the reading of the photoelectric signal generated by the photoelectric converter through the signal reading line, wherein the driving transistor and the reading control transistor are formed by the same process.

In some embodiments, the photoelectric converter is formed to be located between the pixel defining layer and the photoelectric reading circuit in a direction perpendicular to the array substrate.

In some embodiments, the light emitting unit is an organic light emitting diode. The step of forming the light emitting unit comprises: sequentially forming an anode layer, an organic layer, and a cathode layer on the first surface. The anode layer is formed to be electrically connected to the output terminal of the pixel driving circuit.

According to yet another aspect of the present disclosure, there is proposed a method of manufacturing a display panel comprising a plurality of pixel units arranged in an array. The method comprises the following steps for each of the pixel units: forming an array substrate comprising a pixel driving circuit; forming a pixel defining layer on a first surface of the array substrate wherein the first surface is far away from a substrate of the array substrate; forming a via hole in the pixel defining layer; forming a light emitting unit in the via hole, so that the light emitting unit is electrically connected to an output terminal of the pixel driving circuit; forming an upper cover which comprises a photoelectric reading circuit and a photoelectric converter, wherein the photoelectric reading circuit is electrically connected to the photoelectric converter; and mating the upper cover with the pixel defining layer, so that light emitted by the light emitting unit is received by the photoelectric converter.

In some embodiments, the step of forming the pixel defining layer further comprises: forming a light transmitting portion in the pixel defining layer, wherein the light transmitting portion forms a light transmitting region on sidewalls of the via hole.

In some embodiments, the step of mating the upper cover with the pixel defining layer causes the photoelectric converter to receive the light emitted by the light emitting unit through at least the light transmitting portion.

In some embodiments, the step of mating the upper cover with the pixel defining layer causes orthographic projection of the photoelectric converter on the array substrate to at least partially overlap with orthographic projection of the light transmitting portion on the array substrate.

In some embodiments, the step of mating the upper cover with the pixel defining layer causes orthographic projection of the photoelectric converter on the array substrate not to overlap with orthographic projection of the light emitting unit on the array substrate.

In some embodiments, the step of mating the upper cover with the pixel defining layer causes the photoelectric converter to be located between the pixel defining layer and the photoelectric reading circuit in a direction perpendicular to the array substrate.

In some embodiments, the light emitting unit is an organic light emitting diode, and the step of forming the light emitting unit comprises: sequentially forming an anode layer, an organic layer, and a cathode layer on the first surface. The anode layer is formed to be electrically connected to the output terminal of the pixel driving circuit.

According to still another aspect of the present disclosure, there is proposed a pixel light emitting compensation method for the display panel according to the above embodiments. The method comprises: providing, by the data driving circuit, a first data voltage to the pixel driving circuit, so that the pixel driving circuit drives the light emitting unit to emit light with initial brightness; receiving, by the photoelectric converter, the light with the initial brightness, and generating a photoelectric signal; reading, by the photoelectric reading circuit, the photoelectric signal to the compensation processor; calculating, by the compensation processor, a brightness compensation value, and providing the brightness compensation value to the data driving circuit; and providing, by the data driving circuit, a second data voltage to the pixel driving circuit, so that the pixel driving circuit drives the light emitting unit to compensate for brightness to emit light.

According to still another aspect of the present disclosure, there is proposed a display apparatus comprising the display panel according to the above embodiments.

BRIEF DESCRIPTION OF THE ACCOMPANYING DRAWINGS

DETAILED DESCRIPTION

In order to make the purposes, technical solutions, and advantages of the embodiments of the present disclosure more obvious, the technical solutions in the embodiments of the present disclosure will be described clearly and completely in combination with the accompanying drawings in the embodiments of the present disclosure. Obviously, the embodiments described are a part of the embodiments of the present disclosure, instead of all the embodiments. All other embodiments obtained by those of ordinary skill in the art based on the described embodiments of the present disclosure without any creative work belong to the protection scope of the present disclosure. It should be illustrated that throughout the accompanying drawings, the same elements are represented by the same or similar reference signs. In the following description, some specific embodiments are used for descriptive purposes only and should not be construed as any limitation to the present disclosure, but merely as examples of the embodiments of the present disclosure. When it may cause confusion in the understanding of the present disclosure, conventional structures or constructions will be omitted. It should be illustrated that shapes and sizes of components in the figures do not reflect true sizes and proportions, but merely illustrate content of the embodiments of the present disclosure.

Herein, transistors mentioned in the present disclosure may be Thin Film Transistors (TFTs). The transistors may be N-type or P-type transistors, and by exchanging high levels with low levels, the two types of transistors may be used interchangeably. In the following description, N-type transistors are taken as an example, and each of the transistors is turned on when a gate thereof is input with a high level, and is turned off when the gate is input with a low level. Hereinafter, each of the transistors is described as comprising a gate, a first electrode, and a second electrode. It should be understood that the first electrode is one of a source and a drain, and the second electrode is the other of the source and the drain.

Hereinafter, various embodiments of the present disclosure will be described with reference to the accompanying drawings.

Figure 1:
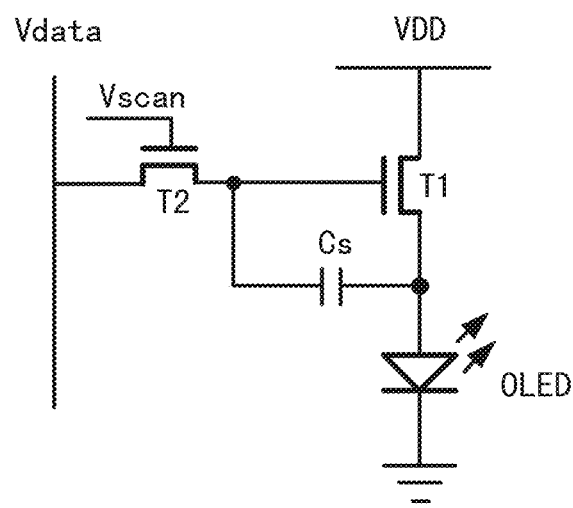
FIG. 1 illustrates a schematic circuit diagram of a pixel driving circuit for a pixel unit of an AMOLED panel.
Figure 2:
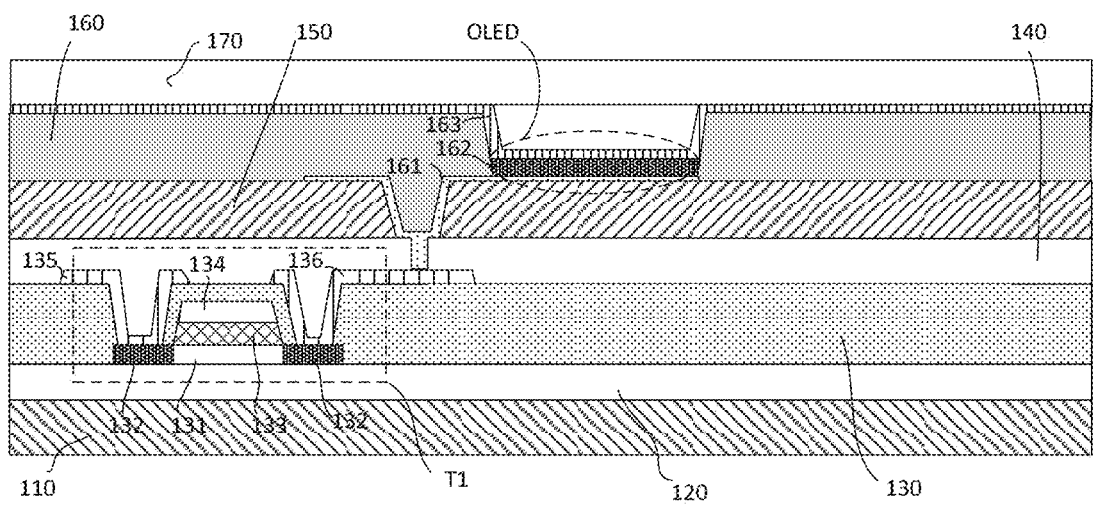
FIG. 2 illustrates a structural diagram of a display panel comprising the pixel driving circuit shown in FIG. 1 and an OLED light emitting unit.

FIG. 1 illustrates a schematic circuit diagram of a pixel driving circuit 100 for a pixel unit of an AMOLED panel. FIG. 2 illustrates a structural diagram of a display panel comprising the pixel driving circuit 100 shown in FIG. 1 and an OLED light emitting unit. For convenience of description, only one pixel unit is shown in FIG. 2.

As shown in FIG. 1, the circuit structure of the pixel driving circuit 100 schematically has a 2T1C structure, which comprises a driving transistor T1, a light emitting control transistor T2, and a storage capacitor Cs. The pixel driving circuit 100 is used to drive the OLED light emitting unit. The OLED light emitting unit is current-driven and requires stable current to control light emitting.

As shown in FIG. 2, only the driving transistor T1 (a rectangular dotted block in the figure) in the pixel driving circuit 100 and the OLED light emitting unit (an elliptical dotted block in the figure) are schematically shown in a stacked structure of the display panel. Specifically, the structure in FIG. 2 comprises a substrate 110, a buffer layer 120, an interlayer dielectric layer 130, a passivation layer 140, a resin layer 150, and a pixel defining layer 160, which are sequentially stacked and constitute a display substrate of the display panel. In addition, the display panel further comprises an upper cover 170 which is mated with the display substrate to form the display panel. The driving transistor T1 is formed in the interlayer dielectric layer 130 and is covered by the passivation layer 140. Therefore, the substrate 110, the buffer layer 120, the interlayer dielectric layer 130, the passivation layer 140, and the resin layer 150 may be collectively referred to as an array substrate. The OLED light emitting unit is formed in the pixel defining layer 160 and is electrically connected to the driving transistor T1 in the interlayer dielectric layer 130 through a via hole. It should be understood that in other embodiments, some layers in the structure shown in FIG. 2 may be removed, or new layers may be added, which is not limited in the present disclosure.

The specific structure of the driving transistor T1 of the pixel driving circuit 100 comprises an active layer formed on the buffer layer 120. The active layer comprises a channel region 131 and doped regions 132 located on opposite sides of the channel region 131. A gate insulating layer 133 is formed on the active region, and a gate 134 is formed on the gate insulating layer 133. Both of the gate insulating layer 133 and the gate 134 are covered on the active layer by the interlayer dielectric layer 130. A position of orthographic projection of the channel region 131 of the active layer on the substrate 110 corresponds to a position of orthographic projection of the gate 134 on the substrate 110. The interlayer dielectric layer 130 also has via holes at positions above the doped regions 132, and a source 135 and a drain 136 are formed in the via holes. The source 135 and the drain 136 are electrically connected to the doped regions 132 on the opposite sides of the channel region 131 respectively. As shown in FIG. 1, in the present embodiment, the driving transistor T1 is exemplified as having a top-gate structure, but it should be understood that in other embodiments, the driving transistor T1 may also have a bottom-gate structure or other suitable structures, which may not affect implementations of the embodiments of the present disclosure. It should also be understood that, in other embodiments, positions of the source 135 and the drain 136 may be interchanged.

A specific structure of the OLED light emitting unit comprises an anode layer 161, an organic layer 162, and a cathode layer 163 which are formed on the resin layer 150. Before the anode layer 161 is manufactured, via holes are firstly formed at positions above the drain 136 in the resin layer 150 and the passivation layer 140, so that a material of the anode layer 161 fills the via holes and thereby the anode layer 161 is electrically connected to the drain 136. The organic layer 162 is a light emitting layer, and when corresponding voltages are connected to the anode layer 161 and the cathode layer 163 respectively, the organic layer 162 may emit light of a specific color by means of neutralization of electrons and holes. The cathode layer 163 covers the organic layer and covers the pixel defining layer 160. The light emission of the OLED may be divided into two cases, i.e., top emission and bottom emission. In a case of the top emission, light emitted by the OLED light emitting unit is emitted from the upper cover 170. In a case of the bottom emission, the light emitted by the OLED light emitting unit is emitted from the substrate 110. It should be understood that in order for the light to be emitted smoothly, a material or structure of layers on a light path needs to be adaptively modified, which is not specifically described here in the present disclosure.

In FIG. 1, when a certain row of pixel units is scanned using a scanning line, a scanning signal Vscan is at a high level. For each pixel unit in the row of pixel units, T2 is turned on, and a data line writes a data signal Vdata to the storage capacitor Cs. After the scanning of the row is completed, the scanning signal Vscan of the scanning line becomes a low level, so that T2 is turned off. At this time, T1 is driven by a voltage stored on the storage capacitor Cs, so that T1 generates current to drive the OLED light emitting unit to ensure that the OLED light emitting unit continuously emits light (for example, within one frame of display). A formula of the light emitting current of the OLED light emitting unit is $Ids=K(Vdata-Vth)^2$, where K is a parameter related to a process, design, and a material, and Vth is a threshold voltage of T1. It may be seen that a value of Ids is at least affected by three parameters, i.e., K, Vdata and Vth. Specifically, when the OLED material itself is degraded, the parameter K may change. Since distances between the pixel units and the data line are different, data signals received by the pixel units may be subjected to different voltage drops, which may affect Vdata of the respective pixel units. Threshold values of driving transistors of the respective pixel units may be unevenly distributed or may drift, which may cause the driving transistors of the respective pixel units to have different values of Vth. All these factors may cause uneven brightness (i.e., mura) of the display panel. Therefore, there is a need for designs to compensate for brightness for this uneven phenomenon.

Generally, compensation is divided into internal compensation and external compensation. For example, in the related art, Vth may be removed from the formula of the driving current by implementing appropriate design of the structure and timing of the above pixel driving circuit, so that the panel may not cause mura due to the difference in the driving transistors, which is the internal compensation. This compensation method may only be used to implement compensation for the factor of Vth, but it is difficult to implement compensation for all the factors which cause mura, and therefore this compensation method has great limitations.

The external compensation comprises an optical external compensation method (i.e., a Demura method) and an electrical external compensation method. In an optical external compensation method in the related art, a brightness signal of a panel is extracted using a method such as optical CCD photography, etc., and mura data is identified according to a relevant algorithm, to generate Demura data according to a corresponding algorithm, and burn the Demura data into a FLASH ROM of the panel to achieve compensation effects. However, this compensation method is only suitable for initial compensation before the panel leaves a factory, and it is difficult to achieve real-time compensation for the panel.

In order to at least partially solve the problems in the existing compensation scheme, the embodiments of the present disclosure, based on, for example, the display panel shown in FIG. 2, realize a real-time comprehensive compensation scheme by disposing a photoelectric converter in the display panel to collect intensity of light emitted by the OLED light emitting unit and adjust a data voltage to be provided to a pixel based on the detected intensity.

Figure 3:
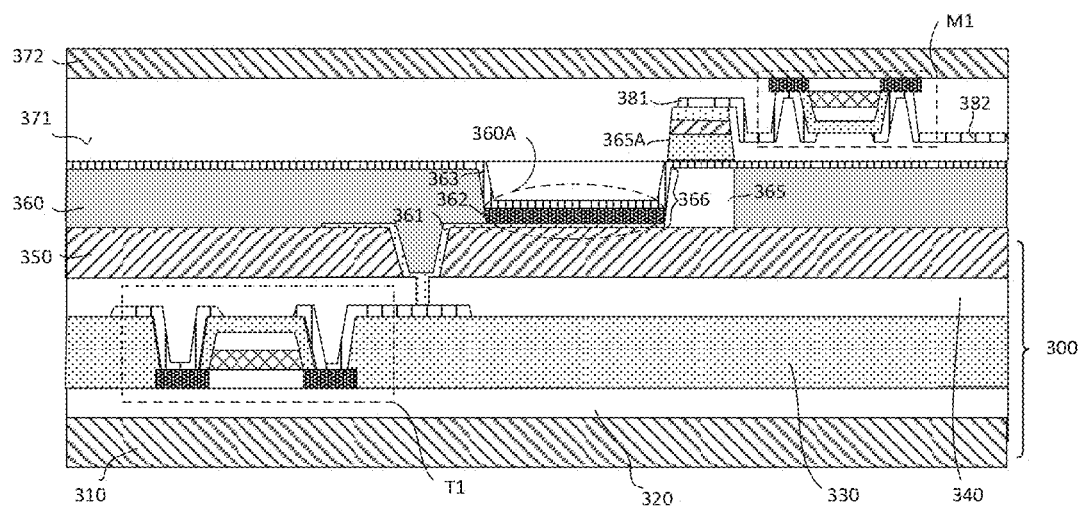
FIG. 3 illustrates a structural diagram of a display panel according to an embodiment of the present disclosure.

Specifically, the present disclosure provides a display panel comprising a plurality of pixel units arranged in an array. FIG. 3 illustrates a structural diagram of a display panel according to an embodiment of the present disclosure. For convenience of description, only one pixel unit 30 is illustrated in FIG. 3.

As shown in FIG. 3, the pixel unit comprises an array substrate 300, a pixel defining layer 360, a light emitting unit 360A, and a photoelectric converter 365A.

The array substrate 300 comprises a substrate 310, a buffer layer 320, an interlayer dielectric layer 330, a passivation layer 340, and a resin layer 350. A pixel driving circuit is formed in the array substrate 300. For convenience of description, only a driving transistor T1 in the pixel driving circuit is shown in FIG. 3. The driving transistor T1 is formed in the interlayer dielectric layer 330 and is covered by the passivation layer 340. The driving transistor T1 is used to generate driving current and provide the driving current to an output terminal of the pixel driving circuit. It should be understood that, in other embodiments, certain layers (such as the buffer layer 320 and the resin layer 350) in the structure shown in the array substrate may be removed, or new layers may be added, which is not limited in the present disclosure.

The pixel defining layer 360 is disposed on a first surface of the array substrate 300 (i.e., a surface far away from the substrate 310). The pixel defining layer 360 has a via hole therein for accommodating the light emitting unit 360A. In some embodiments of the present disclosure, the pixel defining layer 360 comprises a light transmitting portion 365 which forms a part of sidewalls of the via hole, i.e., a light transmitting region 366 on the sidewalls of the via hole. The light transmitting portion 365 is shown in FIG. 3 as being located on a side of the via hole opposite to the driving transistor T1, and it should be understood that this is only exemplary. In other embodiments, the light transmitting portion 365 may be located in any orientation of the via hole, and thus may be used to form any region of the sidewalls of the via hole.

As an example of the light emitting unit 360A, the OLED light emitting unit shown in FIG. 3 is disposed in the via hole and covers a bottom surface and the sidewalls of the via hole. Specifically, the OLED light emitting unit comprises an anode layer 361, an organic layer 362, and a cathode layer 363. Before the anode layer 361 is manufactured, the via hole is firstly formed in the array substrate 300, so that a material of the anode layer 361 fills the via hole and thus the anode layer 361 is electrically connected to an output terminal of the pixel driving circuit (for example, the drain of the driving transistor T1 as shown in FIG. 3). Thereby, the organic layer 362 emits light under the driving of the driving current from the driving transistor T1. The embodiment shown in FIG. 3 is a case of top emission, and therefore an upper cover is also shown in the figure. The upper cover covers the pixel defining layer 360, and the light emitted by the OLED light emitting unit is emitted from the upper cover. The upper cover is shown in FIG. 3 as comprising a cover substrate 372 and an intermediate layer 371. It should be understood that, since the upper cover is mated with the display substrate composed of the array substrate 300 and the pixel defining layer 360 after the manufacturing of the structure on the upper cover is completed, the upper cover shown in FIG. 3 is inverted.

The photoelectric converter 365A is disposed adjacent to the light transmitting portion 365, so that the light emitted by the OLED light emitting unit may at least pass through the light transmitting portion 365 and reach the photoelectric converter 365A (it should be understood that according to a position relationship between the photoelectric converter and the OLED light emitting unit, in some embodiments, the light emitted by the OLED light emitting unit may also be directly irradiated to the photoelectric converter). In some embodiments, orthographic projection of the photoelectric converter 365A on the array substrate 300 at least partially overlaps with orthographic projection of the light transmitting portion 365 on the array substrate 300 to facilitate the photoelectric converter 365A to receive the light from the OLED light emitting unit. In some embodiments, the orthographic projection of the photoelectric converter 365A on the array substrate 300 does not overlap with orthographic projection of the OLED light emitting unit on the array substrate 300, so as to avoid affecting normal light emission of the OLED display panel.

In FIG. 3, the photoelectric converter 365A is exemplified as a PIN photodiode which is exemplarily placed in the upper cover. When the OLED light emitting unit for top emission shown in FIG. 3 emits light, there may be light irradiated to the PIN photodiode placed in the upper cover, to cause the PIN photodiode to generate a photoelectric signal. It should be understood that, in other embodiments of the present disclosure, the photoelectric converter 365A may be implemented as any photoresistor, phototransistor, photodiode, or photocoupler having a photoelectric conversion capability.

In the embodiment of FIG. 3, the PIN photodiode is shown as being placed on the cathode layer 363 of the OLED light emitting unit. It should be understood that, in other embodiments of the present disclosure, the PIN photodiode may be spaced apart from the OLED light emitting unit and the pixel defining layer 360 by a certain distance.

In the embodiment of FIG. 3, the pixel defining layer 360 having the light transmitting portion 365 of a specific size is shown. It should be understood that the light transmitting portion 365 is to facilitate the PIN photodiode to receive the light emitted by the OLED light emitting unit, and thereby to set a position of the PIN photodiode more flexibly. However, if the size of the light transmitting portion 365 is too large, it may affect normal display of the display panel (for example, leakage of light between different pixels causes mixed images). Therefore, the size of the light transmitting portion 365 should be appropriately set. In some other embodiments of the present disclosure, the pixel defining layer 360 may not comprise the light transmitting portion 365 therein. In these embodiments, a position of the photoelectric converter 365A needs to be appropriately set, so that it may directly receive the light emitted by the OLED light emitting unit, rather than being completely blocked by the pixel defining layer.

In some embodiments, the display panel further comprises a photoelectric reading circuit, which is electrically connected to the PIN photodiode to read the photoelectric signal generated by the PIN photodiode. For convenience of description, only a reading control transistor M1 in the photoelectric reading circuit is shown in the embodiment of FIG. 3. The reading control transistor M1 has a source 381 connected to the PIN photodiode, and a drain 382 connected to a signal reading line in the display panel. By changing a level of a gate of M1, the photoelectric signal generated by the PIN photodiode is controlled to be transferred to an external circuit through the signal reading line for compensation calculation. In FIG. 3, the photoelectric reading circuit is also located in the upper cover.

In the embodiment shown in FIG. 3, for the sake of simplicity, a specific layered structure of the intermediate layer 371 in the upper cover is not exemplarily described. It should be understood by those skilled in the art that the intermediate layer in the upper cover may be implemented by any layered structure, as long as the light emitted by the light emitting unit 360A may be allowed to be transmitted therethrough and the circuit structure of the photoelectric reading circuit may be formed therein. In addition, there may be other layer structures between the cover substrate 372 and the intermediate layer 371 of the upper cover, which will not be described in detail in the present disclosure.

In some embodiments, the photoelectric converter 365A is located between the pixel defining layer 360 and the photoelectric reading circuit in a direction perpendicular to the array substrate 300.

Figure 4:
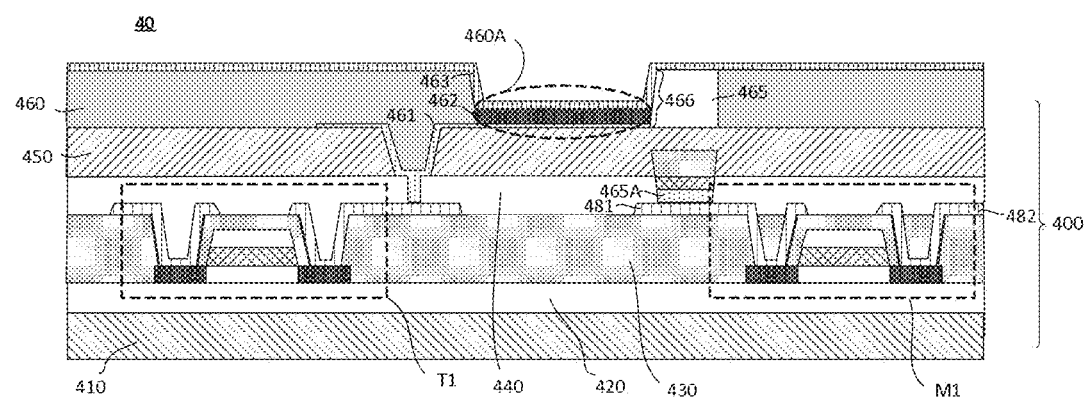
FIG. 4 illustrates a structural diagram of a display panel according to another embodiment of the present disclosure.

FIG. 4 illustrates a structural diagram of a display panel according to another embodiment of the present disclosure. For convenience of description, only one pixel unit 40 is illustrated in FIG. 4.

As shown in FIG. 4, the pixel unit 40 comprises an array substrate 400, a pixel defining layer 460, a light emitting unit 460A, and a photoelectric converter 465A.

The array substrate 400 comprises a substrate 410, a buffer layer 420, an interlayer dielectric layer 430, a passivation layer 440, and a resin layer 450. A pixel driving circuit is formed in the array substrate 400. For convenience of description, only a driving transistor T1 in the pixel driving circuit is shown in FIG. 4. The driving transistor T1 is formed in the interlayer dielectric layer 430 and is covered by the passivation layer 440. The driving transistor T1 is used to generate driving current and provide the driving current to an output terminal of the pixel driving circuit. It should be understood that, in other embodiments, certain layers (such as the buffer layer 420 and the resin layer 450) in the structure shown in the array substrate may be removed, or new layers may be added, which is not limited in the present disclosure.

The pixel defining layer 460 is disposed on a first surface of the array substrate (i.e., a surface far away from the substrate 410). The pixel defining layer 460 has a via hole therein for accommodating the light emitting unit 460A. In some embodiments of the present disclosure, the pixel defining layer 460 comprises a light transmitting portion 465 which forms a part of sidewalls of the via hole, i.e., a light transmitting region 466 on the sidewalls of the via hole. The light transmitting portion 465 is shown in FIG. 4 as being located on a side of the via hole opposite to the driving transistor T1, and it should be understood that this is only exemplary. In other embodiments, the light transmitting portion 465 may be located in any orientation of the via hole, and thus may be used to form any region of the sidewalls of the via hole.

As an example of the light emitting unit 460A, the OLED light emitting unit shown in FIG. 4 is disposed in the via hole and covers a bottom surface and the sidewalls of the via hole. Specifically, the OLED light emitting unit comprises an anode layer 461, an organic layer 462, and a cathode layer 463. Before the anode layer 461 is manufactured, the via hole is firstly formed in the array substrate 400, so that a material of the anode layer 461 fills the via hole and thus the anode layer 461 is electrically connected to an output terminal of the pixel driving circuit (for example, the drain of the driving transistor T1 as shown in FIG. 4). Thereby, the organic layer 462 emits light under the driving of the driving current from the driving transistor T1. The embodiment shown in FIG. 4 is a case of bottom emission, and therefore the structure of the upper cover in FIG. 3 is omitted in FIG. 4. The light emitted by the OLED light emitting unit is emitted from the substrate 410.

The photoelectric converter 465A is disposed adjacent to the light transmitting portion 465, so that the light emitted by the OLED light emitting unit may at least pass through the light transmitting portion 465 and reach the photoelectric converter 465A (it should be understood that according to a position relationship between the photoelectric converter and the OLED light emitting unit, in some embodiments, the light emitted by the OLED light emitting unit may also be directly irradiated to the photoelectric converter). In some embodiments, orthographic projection of the photoelectric converter 460A on the array substrate 400 at least partially overlaps with orthographic projection of the light transmitting portion 465 on the array substrate to facilitate the photoelectric converter 465A to receive the light from the OLED light emitting unit. In some embodiments, the orthographic projection of the photoelectric converter 465A on the array substrate 400 does not overlap with orthographic projection of the OLED light emitting unit on the array substrate, so as to avoid affecting normal light emission of the OLED display panel.

In FIG. 4, the photoelectric converter 465A is exemplified as a PIN photodiode which is exemplarily placed in the array substrate 400. The PIN photodiode in FIG. 4 is formed in the passivation layer 440 and the resin layer 450. When the OLED for bottom emission shown in FIG. 4 emits light, there may be light irradiated to the PIN photodiode placed in the array substrate 400, to cause the PIN photodiode to generate a photoelectric signal.

In the embodiment of FIG. 4, the pixel defining layer 460 having the light transmitting portion 465 of a specific size is shown. It should be understood that the light transmitting portion 465 is to facilitate the PIN photodiode to receive the light emitted by the OLED light emitting unit, and thereby to set a position of the PIN photodiode more flexibly. However, if the size of the light transmitting portion 465 is too large, it may affect normal display of the display panel. Therefore, the size of the light transmitting portion 465 should be appropriately set. In some other embodiments of the present disclosure, the pixel defining layer 460 may not comprise the light transmitting portion 465 therein. In these embodiments, a position of the photoelectric converter 465A needs to be appropriately set, so that it may directly receive the light emitted by the OLED light emitting unit, rather than being completely blocked by the pixel defining layer 460.

In some embodiments, the display panel further comprises a photoelectric reading circuit, which is electrically connected to the PIN photodiode to read the photoelectric signal generated by the PIN photodiode. For convenience of description, only a reading control transistor M1 in the photoelectric reading circuit is shown in the embodiment of FIG. 4. The reading control transistor M1 has a source 481 connected to the PIN photodiode, and a drain 482 connected to a signal reading line in the display panel. By changing a level of a gate of M1, the photoelectric signal generated by the PIN photodiode is controlled to be transferred to an external circuit through the signal reading line for compensation calculation. In a case of bottom emission, the photoelectric reading circuit is also formed in the array substrate 400. Specifically, as shown in FIG. 4, the reading control transistor M1 and the driving transistor T1 may have the same or similar structures, and may be formed simultaneously by the same process, thereby simplifying the process of forming the display panel 400.

In some embodiments, the photoelectric converter is located between the pixel defining layer 460 and the photoelectric reading circuit in a direction perpendicular to the array substrate.

Figure 5:
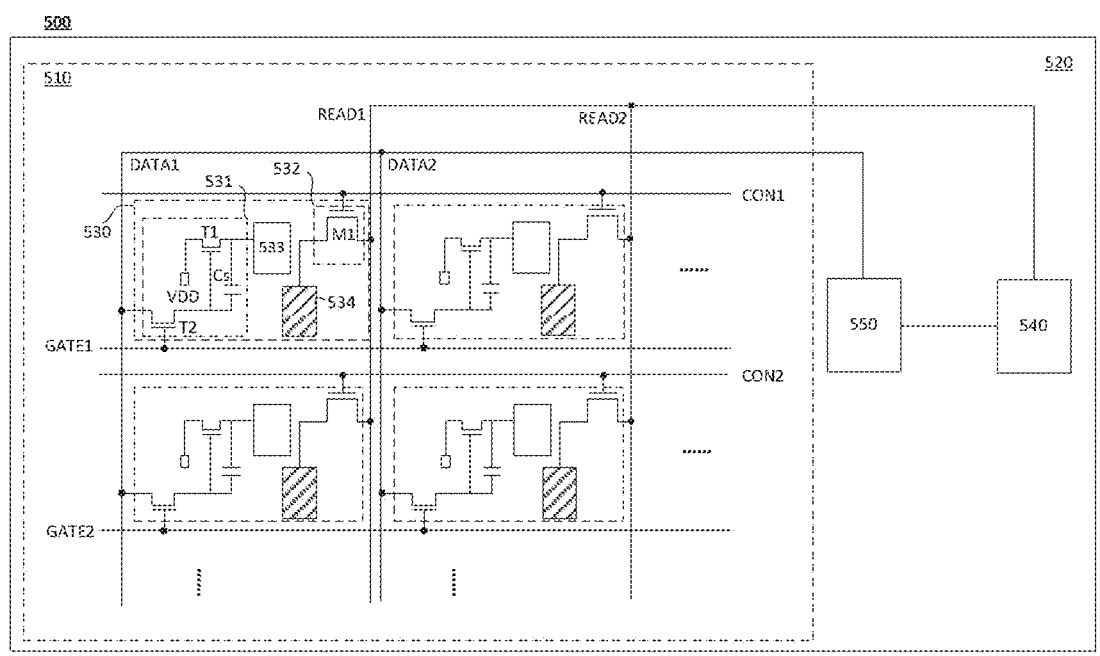
FIG. 5 illustrates a structural circuit diagram of a display panel according to an embodiment of the present disclosure.

FIG. 5 illustrates a structural circuit diagram of a display panel 500 according to an embodiment of the present disclosure. The display panel 500 comprises an effective display region 510 and a non-display region 520. The effective display region comprises a plurality of pixel units 530 arranged in an array. Each of the pixel units 530 in the display panel 500 may have the structure of the pixel unit shown in FIG. 3 or FIG. 4.

The non-display region 520 comprises a compensation processor 540 and a data driving circuit 550. It should be understood that, in other embodiments of the present disclosure, the compensation processor 540 may also be located outside the display panel 500.

Each pixel unit 530 comprises a pixel driving circuit 531, a photoelectric reading circuit 532, a light emitting unit 533, and a photoelectric converter 534. In addition, the pixel unit 530 further comprises a plurality of gate lines GATE (for example, GATE1, GATE2, . . . ), a plurality of data lines DATA (for example, DATA1, DATA2, . . . ), a plurality of signal reading lines READ (for example, READ1, READ2, . . . ) and a plurality of reading control lines CON (for example, CON1, CON2, . . . ).

The pixel driving circuit 531 comprises a driving transistor T1, a light emitting control transistor T2, and a storage capacitor Cs. A connection relationship and the driving principle of the pixel driving circuit 531 may be known with reference to the description described above with reference to FIG. 1, and will not be described in detail here. Each pixel driving circuit 531 receives a data signal from a data driving circuit 550 through a data line DATA under control of a corresponding gate line GATE, and generates driving current related to a level of the data signal DATA to drive the light emitting unit 533 (for example, an OLED Light emitting unit) to emit light.

The photoelectric reading circuit 532 comprises a reading control transistor M1 for receiving a photoelectric signal from the photoelectric sensor 534 (for example, a PIN photodiode) under control of a reading control line CON, and transferring the received photoelectric signal to the compensation processor 540 through a read signal line READ. Here, the photoelectric signal received by the photoelectric sensor 534 is caused by the light emitted by the light emitting unit 533.

After receiving the photoelectric signal, the compensation processor 540 calculates a compensation brightness value based on the photoelectric signal. Then, the compensation processor 540 transmits the calculated compensation brightness value to the data driving circuit 550, so that the data driving circuit 550 may change light emitting brightness of a corresponding pixel unit by changing a data voltage provided to the data line DATA, thereby achieving pixel-specific comprehensive compensation.

Figure 6:
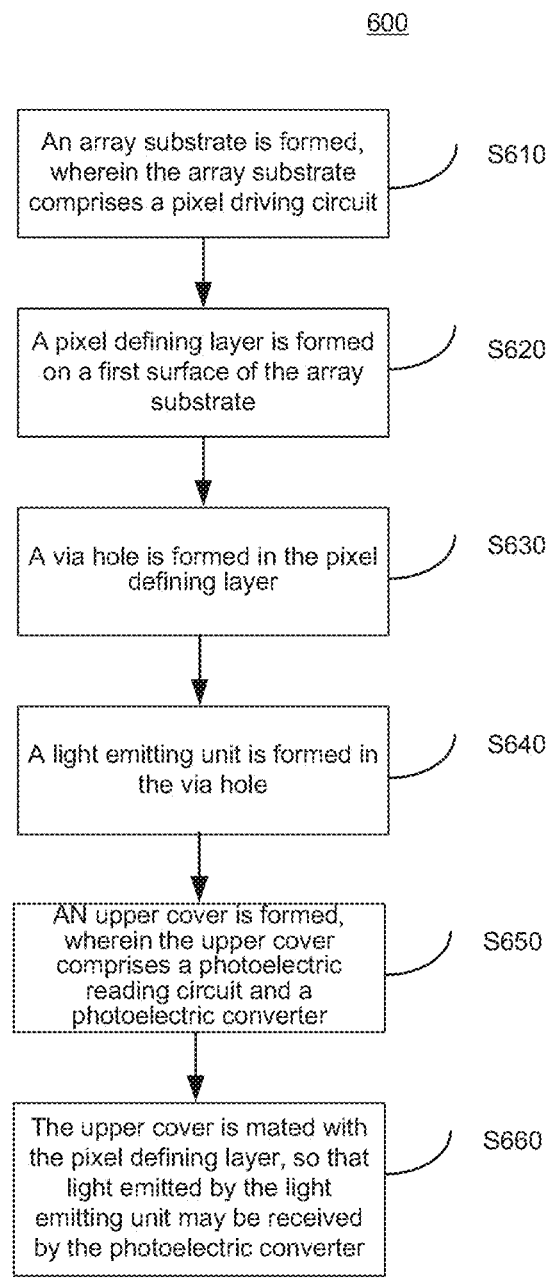
FIG. 6 illustrates a flowchart of a method of manufacturing a display panel according to an embodiment of the present disclosure.

FIG. 6 illustrates a flowchart of a method 600 of manufacturing a display panel according to an embodiment of the present disclosure. The method 600 may be used to manufacture the display panel shown in FIG. 3, and therefore the explanation and description made above with reference to FIG. 3 are also applicable here, and will not be described in detail here.

In step S610, an array substrate is formed. Here, the array substrate comprises a pixel driving circuit.

In step S620, a pixel defining layer is formed on a first surface of the array substrate far away from the substrate.

In some embodiments, step S620 further comprises: forming a light transmitting portion in the pixel defining layer.

In step S630, a via hole is formed in the pixel defining layer.

In some embodiments, the pixel defining layer has a light transmitting portion therein, so that the light transmitting portion constitutes a part of sidewalls of the via hole formed in step S630, i.e., a light transmitting region on the sidewalls.

In step S640, a light emitting unit is formed in the via hole, so that the light emitting unit is electrically connected to an output terminal of the pixel driving circuit.

In some embodiments, the light emitting unit is an organic light emitting diode. Thereby, step S640 comprises: sequentially forming an anode layer, an organic layer, and a cathode layer on the first surface of the array substrate remote from the substrate. Here, the anode layer is formed to be electrically connected to the output terminal of the pixel driving circuit.

In step S650, an upper cover is formed. Here, the upper cover comprises a photoelectric reading circuit and a photoelectric converter, wherein the photoelectric reading circuit is electrically connected to the photoelectric converter.

In step S660, the upper cover is mated with the pixel defining layer, so that light emitted by the light emitting unit may be received by the photoelectric converter.

In some embodiments, the pixel defining layer has a light transmitting portion, and therefore step S660 enables the photoelectric converter to receive at least the light emitted by the light emitting unit through the light transmitting portion.

In some embodiments, after the upper cover is mated with the pixel defining layer, orthographic projection of the photoelectric converter on the array substrate at least partially overlaps with orthographic projection of the light transmitting portion on the array substrate, the orthographic projection of the photoelectric converter on the array substrate does not overlap with orthographic projection of the light emitting unit on the array substrate, and the photoelectric converter is located between the pixel defining layer and the photoelectric reading circuit in a direction perpendicular to the array substrate.

Figure 7:
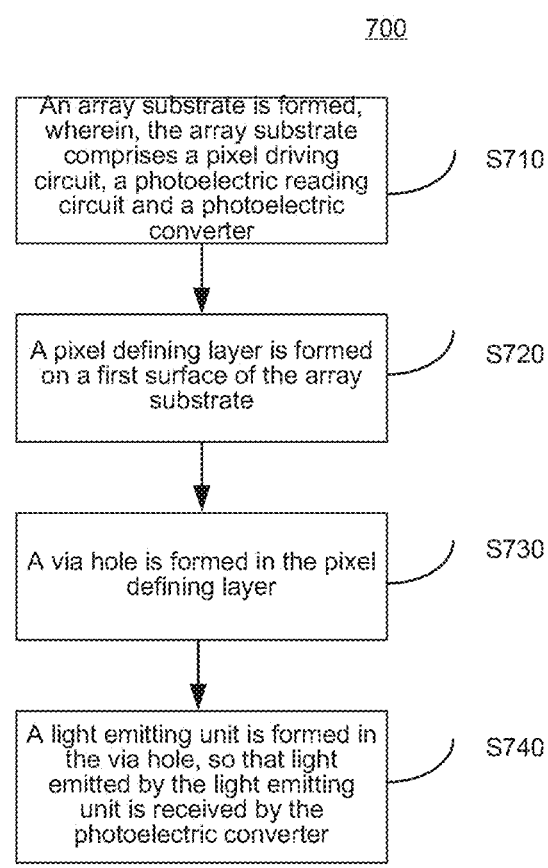
FIG. 7 illustrates a flowchart of a method of manufacturing a display panel according to another embodiment of the present disclosure.

FIG. 7 illustrates a flowchart of a method 700 of manufacturing a display panel according to an embodiment of the present disclosure. The method 700 may be used to manufacture the display panel shown in FIG. 4, and therefore the explanation and description made above with reference to FIG. 4 are also applicable here, and will not be described in detail here.

In step S710, an array substrate is formed. Here, the array substrate comprises a pixel driving circuit, a photoelectric reading circuit and a photoelectric converter, wherein the photoelectric reading circuit is electrically connected to the photoelectric converter.

The pixel driving circuit comprises a driving transistor, and the photoelectric reading circuit comprises a reading control transistor. In some embodiments, the driving transistor and the reading control transistor are formed by the same process.

In step S720, a pixel defining layer is formed on a first surface of the array substrate far away from the substrate.

In some embodiments, step S720 further comprises: forming a light transmitting portion in the pixel defining layer.

In step S730, a via hole is formed in the pixel defining layer.

In some embodiments, the pixel defining layer has a light transmitting portion therein, so that the light transmitting portion constitutes a part of sidewalls of the via hole formed in step S730, i.e., a light transmitting region on the sidewalls.

In step S740, a light emitting unit is formed in the via hole, so that the light emitting unit is electrically connected to an output terminal of the pixel driving circuit. The photoelectric converter and the light emitting unit are formed so that light emitted by the light emitting unit may be received by the photoelectric converter.

In some embodiments, the pixel defining layer has a light transmitting portion therein, and therefore step S740 enables the photoelectric converter to receive at least the light emitted by the light emitting unit through the light transmitting portion.

In some embodiments, the light emitting unit is an organic light emitting diode. Thereby, step S740 comprises: sequentially forming an anode layer, an organic layer, and a cathode layer on the first surface of the array substrate far away from the substrate. Here, the anode layer is formed to be electrically connected to the output terminal of the pixel driving circuit.

In some embodiments, the photoelectric converter, the light transmitting portion, and the light emitting unit are formed so that orthographic projection of the photoelectric converter on the array substrate at least partially overlaps with orthographic projection of the light transmitting portion on the array substrate, the orthographic projection of the photoelectric converter on the array substrate does not overlap with orthographic projection of the light emitting unit on the array substrate, and the photoelectric converter is located between the pixel defining layer and the photoelectric reading circuit in a direction perpendicular to the array substrate.

Figure 8:
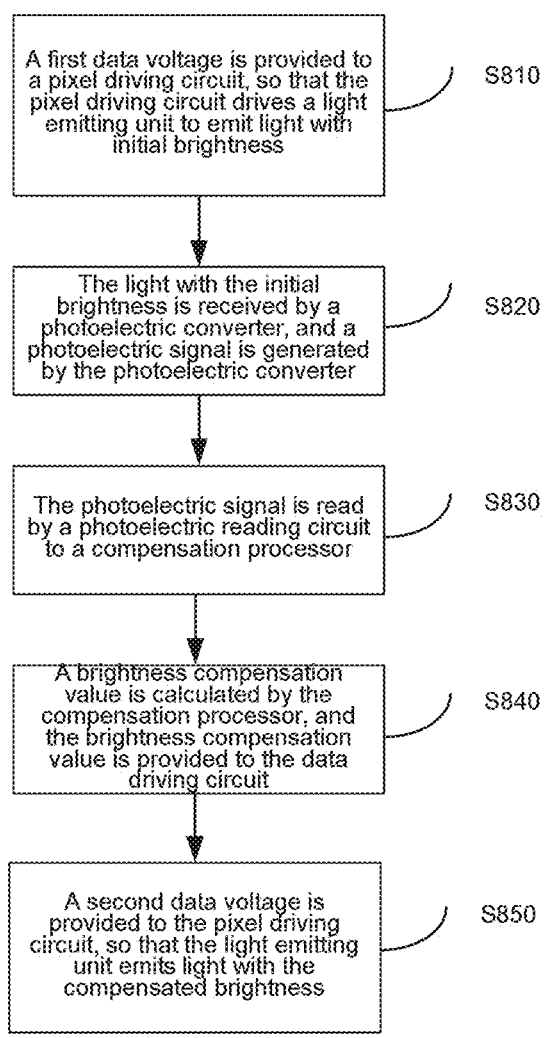
FIG. 8 illustrates a flowchart of a pixel light emitting compensation method for a display panel according to an embodiment of the present disclosure.

FIG. 8 illustrates a flowchart of a pixel light emitting compensation method 800 for a display panel according to an embodiment of the present disclosure. The method 800 may be implemented by using the display panel shown in FIG. 5. Therefore, the explanation and description made above with reference to FIG. 5 are also applicable here, and will not be described in detail here.

In step S810, a first data voltage is provided by a data driving circuit (for example, the data driving circuit 550) to a pixel driving circuit (for example, the pixel driving circuit 531), so that the pixel driving circuit drives a light emitting unit (for example, the light emitting unit 533) to emit light with initial brightness.

In step S820, the light with the initial brightness is received by a photoelectric converter (for example, the photoelectric converter 534), and a photoelectric signal is generated by the photoelectric converter.

In step S830, the photoelectric signal is read by a photoelectric reading circuit (for example, the photoelectric reading circuit 532) to a compensation processor (for example, the compensation processor 540).

In step S840, a brightness compensation value is calculated by the compensation processor, and the brightness compensation value is provided to the data driving circuit.

In step S850, a second data voltage is provided by the data driving circuit to the pixel driving circuit, so that the pixel driving circuit drives the light emitting unit to compensate for the brightness to emit light.

Figure 9:
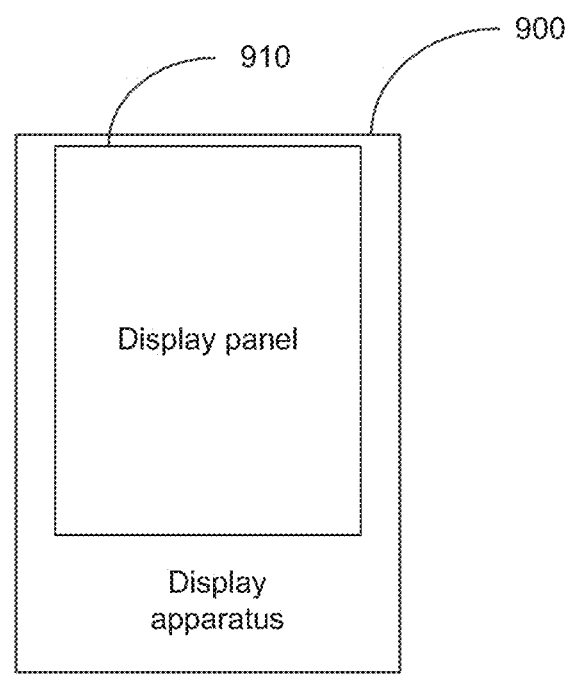
FIG. 9 illustrates a schematic block diagram of a display apparatus according to an embodiment of the present disclosure.

FIG. 9 illustrates a schematic block diagram of a display apparatus 900 according to an embodiment of the present disclosure. As shown in FIG. 9, the display apparatus 900 may comprise the display panel 910 according to the embodiments of the present disclosure described above. The display panel 910 may be implemented by the display panel shown in FIG. 3, FIG. 4, or FIG. 5. The display apparatus 900 according to the embodiments of the present disclosure may be any product or component having a display function, such as electronic paper, a mobile phone, a tablet computer, a television, a display, a notebook computer, a digital photo frame, a navigator, etc.

Although the present disclosure has been described with reference to several exemplary embodiments, it should be understood that the terms used are illustrative and exemplary, and are not restrictive. Since the present disclosure may be embodied in various forms without departing from the spirit or essence of the present disclosure, it should be understood that the embodiments described above are not limited to any of the above details, but should be broadly interpreted within the spirit and scope defined by the appended claims. Therefore, all changes and variations falling within the scope of the claims or their equivalents shall be covered by the appended claims.

We claim:

1. A display panel comprising:
a plurality of pixel units arranged in an array, wherein each of the pixel units comprises:

an array substrate comprising a pixel driving circuit;

a pixel defining layer disposed on a first surface of the array substrate and having a via hole, wherein the first surface is far away from a substrate of the array substrate;

a light emitting unit disposed in the via hole, wherein the light emitting unit is electrically connected to an output terminal of the pixel driving circuit, so that driving current output by the pixel driving circuit drives the light emitting unit to emit light;

a photoelectric converter configured to receive the light emitted by the light emitting unit; and a photoelectric reading circuit electrically connected to the photoelectric converter to read a photoelectric signal generated by the photoelectric converter, a compensation processor electrically connected to the photoelectric reading circuit through a signal reading line, and configured to: receive the photoelectric signal from the photoelectric reading circuit; and calculate a brightness compensation value based on the photoelectric signal; and a data driving circuit, configured to provide a first data voltage to the pixel driving circuit, so that the pixel driving circuit drives the light emitting unit to emit light with initial brightness, to receive the brightness compensation value provided by the compensation processor, and to provide a second data voltage to the pixel driving circuit, so that the pixel driving circuit drives the light emitting unit to compensate for brightness to emit light.

2. The display panel according to claim 1, wherein:

the pixel defining layer comprises a light transmitting portion which forms a light transmitting region on sidewalls of the via hole, the photoelectric converter is configured to receive the light emitted by the light emitting unit through at least the light transmitting portion, and an orthographic projection of the photoelectric converter on the array substrate at least partially overlaps with an orthographic projection of the light transmitting portion on the array substrate.

3. The display panel according to claim 1, wherein an orthographic projection of the photoelectric converter on the array substrate does not overlap with an orthographic projection of the light emitting unit on the array substrate.

4. The display panel according to claim 1, wherein the photoelectric converter and the photoelectric reading circuit are disposed in the array substrate.

5. The display panel according to claim 4, wherein the pixel driving circuit comprises a driving transistor having one of a source or a drain electrically connected to the output terminal of the pixel driving circuit to generate driving current and provide the driving current to the output terminal of the pixel driving circuit, and the photoelectric reading circuit comprises a reading control transistor having one of a source or a drain electrically connected to the photoelectric converter, and the other of the source or the drain electrically connected to a signal reading line to control the reading of the photoelectric signal generated by the photoelectric converter through the signal reading line, wherein the driving transistor and the reading control transistor are formed by the same process.

6. The display panel according to claim 5, wherein the photoelectric converter is located between the pixel defining layer and the photoelectric reading circuit in a direction perpendicular to the array substrate.

7. The display panel according to claim 4, further comprising an upper cover which covers the pixel defining layer, wherein the photoelectric converter and the photoelectric reading circuit are disposed in the upper cover, and wherein the photoelectric converter is located between the pixel defining layer and the photoelectric reading circuit in a direction perpendicular to the array substrate.

8. A display apparatus comprising the display panel according to claim 1.

9. A pixel light emitting compensation method for a display panel comprising a plurality of pixel units arranged in an array, wherein each of the pixel units comprises: an array substrate comprising a pixel driving circuit; a pixel defining layer disposed on a first surface of the array substrate and having a via hole, wherein the first surface is far away from a substrate of the array substrate; a light emitting unit disposed in the via hole, wherein the light emitting unit is electrically connected to an output terminal of the pixel driving circuit, so that driving current output by the pixel driving circuit drives the light emitting unit to emit light; a photoelectric converter configured to receive the light emitted by the light emitting unit; a photoelectric reading circuit electrically connected to the photoelectric converter to read a photoelectric signal generated by the photoelectric converter, wherein the photoelectric converter and the photoelectric reading circuit are disposed in the array substrate; and a compensation processor electrically connected to the photoelectric reading circuit through a signal reading line, the method comprising:

providing, by a data driving circuit, a first data voltage to the pixel driving circuit, so that the pixel driving circuit drives the light emitting unit to emit light with initial brightness;

receiving, by the photoelectric converter, the light with the initial brightness, and generating a photoelectric signal;

reading, by the photoelectric reading circuit, the photoelectric signal to the compensation processor;

calculating, by the compensation processor, a brightness compensation value, and providing the brightness compensation value to the data driving circuit; and providing, by the data driving circuit, a second data voltage to the pixel driving circuit, so that the pixel driving circuit drives the light emitting unit to compensate for brightness to emit light.

* * * * *